United States Patent [19]

Gersbach et al.

[11] Patent Number: 5,629,650
[45] Date of Patent: May 13, 1997

[54] SELF-BIASED PHASE-LOCKED LOOP

[75] Inventors: John E. Gersbach, Burlington; Masayuki Hayashi, Williston; Charles J. Masenas, Essex Junction, all of Vt.

[73] Assignee: International Business Machines Corporation, Armonk, N.Y.

[21] Appl. No.: 593,755

[22] Filed: Jan. 29, 1996

[51] Int. Cl.⁶ .................... H03L 7/085; H03L 7/099
[52] U.S. Cl. .................... 331/17; 331/8; 331/34; 331/108 R; 331/177 R; 327/157
[58] Field of Search .................... 331/8, 17, 34, 331/57, 108 R, 111, 113 R, 116 FE, 177 R; 327/186, 148, 157

[56] References Cited

U.S. PATENT DOCUMENTS

| | | |
|---|---|---|
| 4,494,080 | 1/1985 | Call .................... 331/8 |
| 5,185,584 | 2/1993 | Takeuchi .................... 331/25 |
| 5,300,898 | 4/1994 | Chen et al. .................... 331/57 |
| 5,331,295 | 7/1994 | Jelinek et al. .................... 331/57 |
| 5,334,953 | 8/1994 | Mijuskovic .................... 331/8 |
| 5,347,233 | 9/1994 | Ishibashi et al. .................... 331/2 |
| 5,399,994 | 3/1995 | Siniscalchi et al. .................... 331/17 |
| 5,469,120 | 11/1995 | Nguyen et al. .................... 331/34 X |

*Primary Examiner*—David Mis
*Attorney, Agent, or Firm*—Schmeiser, Olsen & Watts; Robert A. Walsh

[57] ABSTRACT

According to the preferred embodiment, a self-biased phase-locked loop is provided that overcomes the limitations of the prior art bias methods and apparatus. In general, a self-biased current controlled semiconductor device, typically a current controlled oscillator, is self biased by the use of a first feedback path, typically provided by a phase-locked loop, where the feedback path provides a control current for controlling the current controlled device. A second feedback path, typically a pair current mirrors, serves as a bias loop having unity gain. The bias loop provides a bias current that is responsive to the control current. This device has the advantage of being self biasing, thus no other biasing circuitry is required.

22 Claims, 2 Drawing Sheets

SELF-BIASED PHASE-LOCKED LOOP

BACKGROUND OF THE INVENTION

1. Technical Field

This invention generally relates to semiconductor devices, and more specifically relates to biasing currents in semiconductor devices.

2. Background Art

Phase-locked loops (PLLs) are used a wide variety of applications in semiconductor devices. For example, PLLs are used in clock generators, frequency multipliers, frequency synthesizers and servo systems in disk drives. Naturally, in all of these and other applications the accuracy and reliability of the PLL is of critical importance.

Turning to FIG. 1, FIG. 1 is a schematic view of a prior-art phase-locked loop 100. PLL 100 comprises a phase comparator 102, a charge pump 104, a filter 106, a voltage-to-current converter 108, a current-controlled oscillator (ICO) 110, an output circuit 112, a feedback divider 114, and a bias current source 116.

The general operation of PLL's is well known, so only a brief explanation will be given. Phase comparator 102 compares an input signal to a feedback signal from feedback divider 114. Depending upon the phase difference between the input signal and feedback signal, the phase comparator drives charge pump 104. The output of charge pump 104 is filtered by filter 106, and is used to drive voltage-to-current converter 108. Voltage-to-current converter 108 outputs a current that is proportional to the voltage at its inputs. The output current from voltage-to-current converter 108 is used to drive ICO 110, thereby controlling the frequency of the output of ICO 110.

The output of ICO 110 is buffered by output circuit 112, converting the differential output signal to a single-ended output, which is then output and fed back through feedback divider 114 to phase comparator 102. This creams the feedback that facilitates the phase-locked loop operation.

Several bias currents are needed to provide stable and accurate operation of the PLL. In particular, a bias current is used on charge pump 104 to regulate the gain of the PLL, the gain being proportional to the charge pump bias current. In addition, a bias current is used by voltage-to-current converter 108 to set its operating point at the required value. Finally, a bias current is used by ICO 110 to keep it oscillating at a particular center frequency in the presence of voltage, temperature and process variations.

These various bias currents are provided by bias current source 116. Because of the tight tolerances in bias currents required, the prior art has used elaborate and complicated current reference circuits that require special components and careful design. For example, bias current source 116 is typically something like a band gap regulated current source. These current sources use diffused diodes. Fabricating these diodes requires additional process steps that are not normally used in the manufacture of CMOS integrated circuits and may create problems for both yield and tolerances as the process geometries shrink. Additionally, there are few other components available that could be used to supply the necessary bias currents, especially in CMOS technologies. Without these complicated circuits, the prior art approaches required that wide variations in bias current be tolerated at the expense of broad ranges of input control voltage that causes other design difficulties.

The input elements of ICO 110 are shown in an exploded portion 118. This input portion serves to control the oscillator circuit of ICO 110 (not shown), resulting in an output with a frequency proportional to the input current. The input elements include a current mirror comprising N-FETs 130 and 134. The output current of voltage-to-current converter 108 and the bias current from bias current source 116 drives into a diode created by N-FET 130. The current flowing through N-FET 130 is mirrored by N-FET 134. The current flowing through N-FET 134 serves as the input to the oscillator portion 118 of ICO 110.

Thus, PLLs employing current controlled oscillators require bias currents to sustain oscillation at particular desired frequencies. To achieve the required stability in such bias currents, the design of elaborate and complicated current reference components was required. Unfortunately, the existing solutions to the problem were insufficient. Therefore, there existed a need to provide an improved biasing mechanism for PLLs that avoided the complexity and other problems of the prior art.

DISCLOSURE OF INVENTION

According to the present invention, a self-biased current controlled semiconductor device is provided that overcomes the limitations of the prior art biasing methods and apparatus. In general, a current controlled semiconductor device is self-biased by the use of a first feedback path that provides a control current for determining the output of the current controlled device. A second feedback path serves as a bias loop. The bias loop provides to the device a bias current that is responsive to the control current. This device thus has the advantage of being self-biasing, which means that the bias is varied according to the changes in the control current.

In a specific embodiment, the device is a suitable phase-locked loop, and a the first feedback path is a feedback path within the phase-locked loop, where the first feedback path provides a control current for a current controlled oscillator in the phase-locked loop. The second feedback path, typically a pair of current mirrors forming a unity gain bias loop, provides the bias current by mirroring the input current to the current controlled semiconductor device, where the input current is the sum of the control current and the bias current.

The foregoing and other objects, features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Phase-locked loops (PLLs) are used in a variety of device applications. For example, PLLs are used in clock generators, frequency multipliers, frequency synthesizers and servo systems in disk drives. In all of these applications the accuracy of the PLL is of critical importance.

A self-biased phase-locked loop (PLL) in accordance with the present invention avoids the complexity of traditional bias current design, while providing appropriate bias current levels over a wide range of operating temperatures, process parameter values, and input voltages. The self-bias of the current controlled oscillator (ICO) is established through the use of a positive feedback bias loop which responds to the current output from the voltage-to-current (V-to-I) converter to establish a proportional current in the legs of a current mirror, thereby appropriately biasing the ICO, the V-to-I converter, and the charge pump.

The preferred embodiment uses a unity gain feedback loop that senses the control current and sets an appropriate bias current level based on the feedback of the PLL itself. This design provides an accurate and responsive bias current to the ICO, or other current controlled devices. Thus the preferred embodiment offers the advantage of providing bias current that is somewhat self-regulating, eliminating the need for a precision current source to supply the bias current. In addition, the device of the preferred embodiment also allows, a narrower operating range of the V-to-I converter output, easier design of all phase-locked loop circuits, better stability and the elimination of some special chip components. Additionally, the preferred embodiment is able to provide the bias current required for the ICO to maintain a particular output frequency independent of voltage, temperature and chip component values that are present in the PLL.

Figure 1:
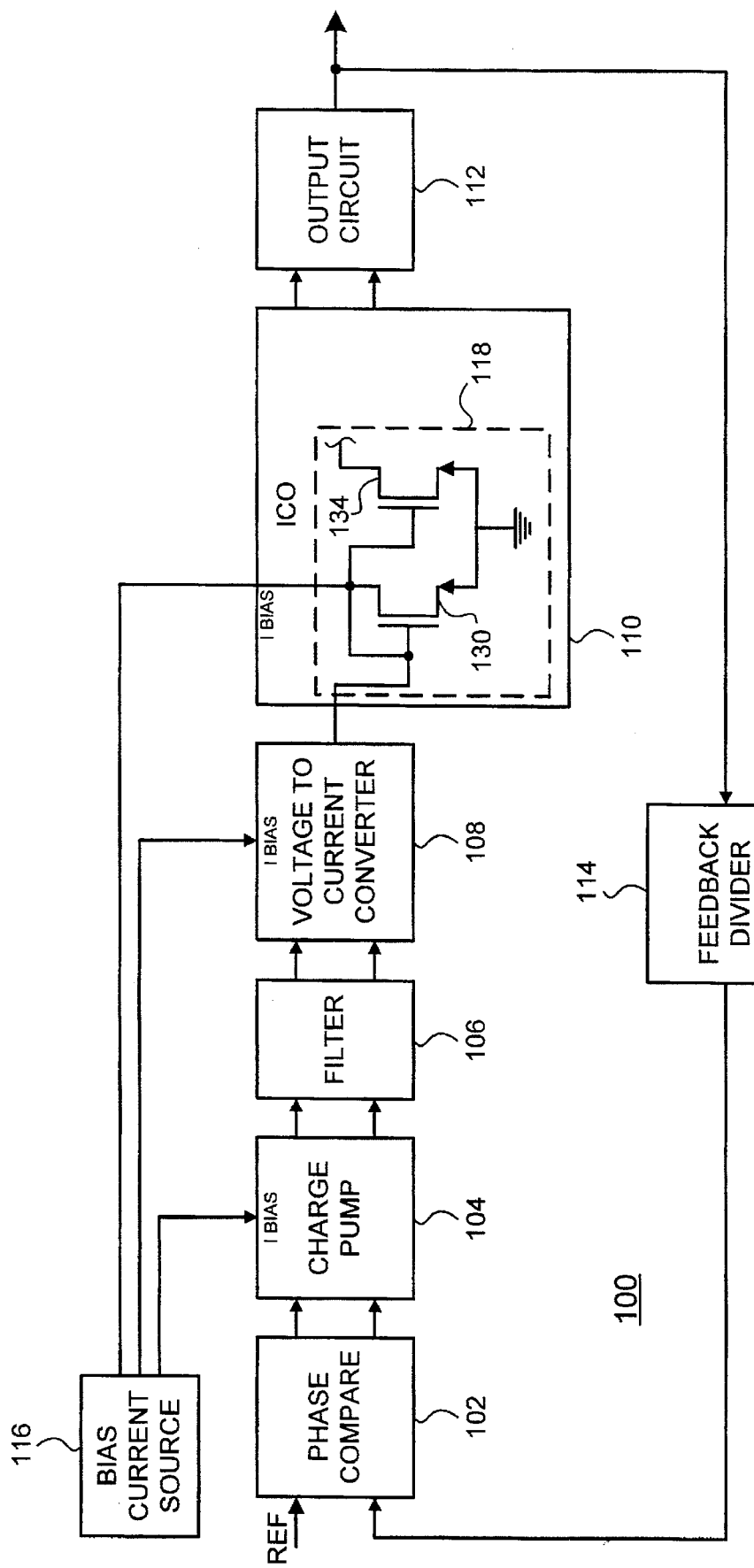
FIG. 1 is a schematic view of a prior art phase-locked loop device.
Figure 2:
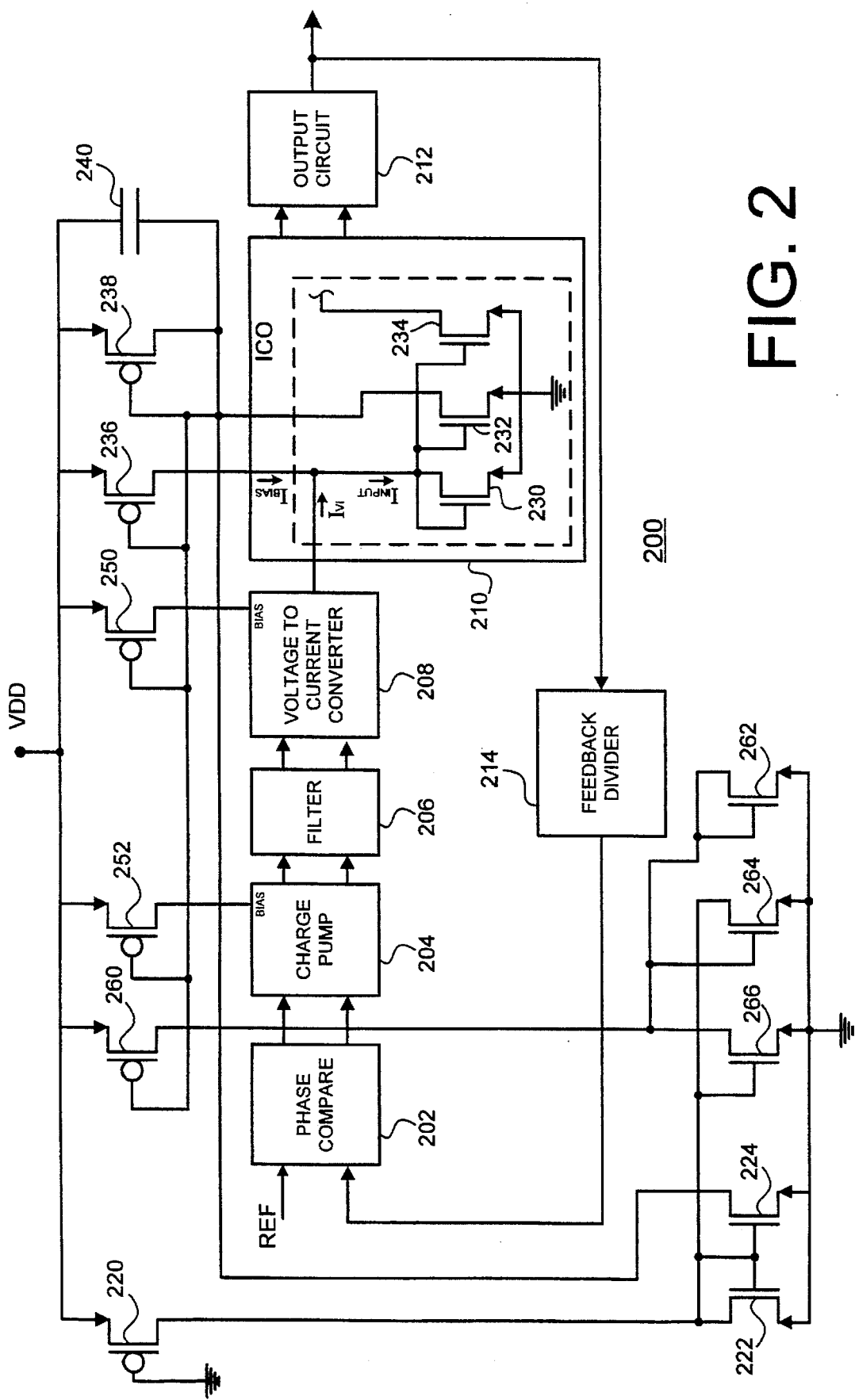
FIG. 2 is a schematic view of a phase-locked loop device in accordance with the preferred embodiment.

Referring to FIG. 2, FIG. 2 is a schematic view of a self-biased PLL 200 in accordance with a preferred embodiment. PLL 200 comprises a phase comparator 202, a charge pump 204, a filter 206, a voltage-to-current (V-to-I) converter 208, a current controlled oscillator (ICO) 210, an output circuit 212, and a feedback divider 214.

Phase comparator 202 compares a reference input signal (REF) to a feedback signal from feedback divider 214. Depending upon the phase difference between the reference input signal and feedback signal, the phase comparator drives charge pump 204. The output of charge pump 204 is filtered by filter 206, and is used to drive voltage-to-current (V-to-I) converter 208. V-to-I converter 208 outputs a current that is proportional to the voltage difference at its inputs. The output current $I_{VI}$ of V-to-I converter 208 is used to drive ICO 210, controlling the frequency of the ICO 210 output. Again, ICO 210 requires a bias current to set the frequency of ICO's output in the appropriate operating range.

ICO 210 is shown with its input elements and biasing mechanism in an exploded view. The other portions of ICO 210, including the oscillator portion of the element, are not shown. The input elements include a current mirror comprising N-FETs 230 and 234.

In particular, the V-to-I converter 208 output current ($I_{VI}$) and the ICO bias current ($I_{BIAS}$) are both sunk by N-FET 230. The total current sunk by N-FET 230 is mirrored by N-FET 234. The mirrored current of N-FET 234 comprises the input current of the oscillator portion of ICO 210. The oscillator portion is typically a differential ring oscillator, one that produces an output signal having a frequency which is proportional to the current at the oscillator portion input (i.e., drain of N-FET 234). Thus, the current flowing through N-FET 234, including the V-to-I converter 208 output $I_{VI}$ and the ICO bias current $I_{BIAS}$, determines the frequency of the output of ICO.

Of course, those skilled in the art will recognize that the labeling of V-to-I converter 208 and ICO 210 as separate elements is essentially arbitrary, and that those elements could have been represented as a single element, namely a voltage controlled oscillator.

The output of ICO 210 is buffered by output circuit 212, converting the differential output signal to a single-ended output, which is output and fed back through feedback divider 214 to phase comparator 202. This creates the feedback that facilitates the well known phase-locked loop operation.

The remaining portions of PLL 200 constitute a self-biasing circuit. The self-biasing circuit comprises a start-up current mechanism, an ICO biasing loop mechanism, a V-to-I biasing mechanism and a charge pump biasing mechanism.

The first portion of the self-biasing circuit is the ICO biasing loop mechanism for ICO 210. Again, ICO 210 has an input current mirror comprising N-FETs 230 and 234. N-FET 230 sinks the sum of the current output of the V-to-I converter ($I_{VI}$) and ICO bias current ($I_{BIAS}$), the sum being the ICO input current ($I_{INPUT}$) (where $I_{VI}$ is positive or negative depending upon the polarity of the input voltage of V-to-I convertor 208). The ICO input current flowing through N-FET 230 is mirrored by N-FET 234. The mirrored current flowing through N-FET 234 serves as the input to the oscillator portion of ICO 210, and determines the oscillation frequency of its output.

N-FETs 230, 232 and P-FETs 236, 238 comprise the biasing loop mechanism for ICO 210. N-FETs 230, 232 and P-FETs 236, 238 form a positive feedback bias loop of near unity gain. The feedback bias loop provides the required bias current $I_{BIAS}$ after the PLL has been powered up. Thus, once the PLL has achieved lock and the bias loop has settled, the only current required from V-to-I convertor ($I_{VI}$) is a control current or a correction current, substantially independent of the operating frequency of the ICO 210. This control or correction current is the ICO input current change resulting from a detected phase difference plus any current due to the bias loop's gain not being exactly unity.

In particular, when the biasing circuit is powered up, N-FET 232 will mirror a current proportional to the ICO input current ($I_{INPUT}$) and drive that current from P-FET 238. P-FET 238 mirrors the input current into P-FET 236, and drives a bias current ($I_{BIAS}$) equal to the input current back down into the bias current input for ICO 210. Thus, N-FETs 230 and 232, and P-FETs 236 and 238 form two current mirrors that combine to create a positive feedback bias loop. In the ideal case, $I_{BIAS}$ will be adjusted by the bias loop to equal $I_{INPUT}$. When $I_{BIAS}$ equals $I_{INPUT}$, the current output $I_{VI}$ from V-to-I convertor 208 nominally goes to zero, with the ICO now biased at the phase locked frequency which corrects the phase error that generated $I_{VI}$.

In practice, it is preferable to keep the bias loop gain slightly below unity to avoid the possibility of the PLL latching. If the bias loop around N-FETs 230, 232 and P-FETs 238, 236 has a gain approximately equal to unity, then $I_{BIAS}$ equals $I_{INPUT}$ during a majority of the time the PLL operates (as described above). With the PLL thus operating, V-to-I converter 208 need only supply a relatively very small current, with the bias loop sustaining its current, and thus $I_{VI}$ is near zero. Only when a correction current is required (i.e., due to a phase shift in the reference input) does $I_{VI}$ become substantial in magnitude.

Thus, the feedback operation of the PLL drives the output oscillation frequency of ICO 210 to the correct value. That oscillation is then maintained, by the bias current $I_{BIAS}$ provided from the bias loop. In particular, V-to-I converter 208 provides the necessary current for ICO 210 to achieve frequency and phase lock, and once that lock is achieved, the current is maintained by the operation of the unity gain bias loop. Thus, V-to-I converter 208 must only provide substantive correction current $I_{VI}$ when there is a change in the phase compared at phase comparator 202. Thus, the bias loop reduces the constant DC current that would normally be needed from V-to-I converter 208.

However, if the loop gain is less than unity, then some DC current (in addition to any correction current) would still need to be provided from V-to-I converter 208. Additionally, if the frequency or phase of operation of the PLL somehow changes, then V-to-I converter 208 needs to supply the correction current $I_{VI}$ to affect that change. But after some time, the bias current $I_{BIAS}$ will equal the input current $I_{INPUT}$ of ICO 210 and will be maintained by the bias current loop.

An additional benefit of the preferred embodiment in reducing the current required from V-to-I converter 208 is an increase in the PLL output linearity. Because the range over which V-to-I converter 208 is linear determines the linearity of the PLL response, the linearity of V-to-I converter 208 is typically very critical. If the PLL response is not linear then the loop gain will be a function of frequency. In the preferred embodiment, the linear operating range requirement is lessened without adversely effecting the PLL output linearity. This results from most of the current required by the ICO 210 being supplied by the bias loop after capacitor 240 is charged up, irrespective of operating frequency. Thus the current range over which linear output is required from the V-to-I converter 208 is reduced.

Capacitor 240 together with P-FET 238 form a low-pass filter that is lower in frequency than the main loop filter 206. Thus selected, the low-pass filter created by capacitor 240 is used to avoid any changes in the AC characteristics of the PLL. Thus, the bias current in the loop will look like a DC current to the phase-locked loop, and not adversely affect its stability. Thus, if the bias loop pole frequency is significantly lower than filter 206 of the PLL, then the bias loop does not affect the gain or frequency response of the PLL.

The ICO biasing loop portion of the self-biasing circuit will not automatically turn on when power is applied to PLL 200. Thus, a start-up current mechanism is provided to start the ICO biasing loop on PLL power up using P-FET 220 and N-FETs 222 and 224. In particular, with P-FET 220's source tied to VDD and its gate grounded, a current is established in P-FET 220 and N-FET 222 on PLL power up. That current is mirrored in N-FET 224. N-FET 224 charges the gate of P-FET 238 (of the ICO biasing loop), providing the minimum current needed to staff the self-biasing circuit. The tolerance and temperature characteristics of this circuit are relatively unimportant because it is only used to get the reference current to a value sufficient to initialize the ICO biasing loop of the self-biasing circuit.

After PLL 200 has been powered up and the minimum current level has been reached in the bias loop, the start-up current is no longer needed. Thus, the start-up current mechanism is shut down to stop the start-up current after power-up. P-FET 260 and N-FETs 262, 264 and 266 are configured to shut down the start-up current after the required level of current has been reached in the ICO bias loop.

In particular, N-FETs 264 and 266 form a cross coupled N-FET latch. The gain of N-FETs 264 and 266 is limited by N-FET 262 and N-FET 222 diodes, respectively. When the bias loop is off, there is zero current in P-FET 260, and N-FETs 222 and 266 will conduct, holding N-FETs 262 and 264 off until a sufficient current develops in the ICO biasing loop, as mirrored by P-FET 260, to overcome the current in N-FET 266. N-FET 264 then turns on and conducts P-FET 220's current, turning off N-FET 224 in the process. This removes the start-up current until the next time the PLL is powered down and powered back up again.

To summarize the operation of the start-up mechanism, when the PLL is powered up, P-FET 220 will turn on and drive current into N-FET 222 diode. That current is mirrored in N-FET 224. With N-FET 224 connected to P-FET 238 of the bias loop, the bias loop will be forced to turn on. When the bias loop turns on, P-FET 260 will turn on as well. This forces the gate of N-FET 264 to a positive voltage. N-FET 264 will then conduct all the current from P-FET 220, forcing N-FET 224 to be off. Thus, from this point on all the current from P-FET 220 will flow through device N-FET 264. With N-FET 224 off, the bias loop operates without further effect by the start-up mechanism.

Another portion of the self-biasing circuit supplies a bias current to V-to-I converter 208 and charge pump 204. In particular, the bias-current supplied to ICO 210 is mirrored for the V-to-I converter 208 biasing and the charge pump 204 current biasing by having P-FETs 250 and 252 mirror the current in P-FET 236.

Thus, P-FET 250 and P-FET 252 provide the bias current to V-to-I converter 208 and charge pump 204 respectively. These bias currents are a mirror of ICO 210's bias current flowing through P-FET 236. The bias current provided by P-FET 250 is ideal for voltage-to-current converter 208. Unfortunately, the bias current provided by P-FET 252 is not ideal for charge pump 204.

The charge pump 204 bias current is not ideal because the loop gain of a PLL is proportional to the charge pump current. Since filter 206 has capacitors on chip, the PLL loop gain is proportional to the charge pump bias current divided by that capacitance of the main loop filter. Because that gain is ideally constant, it is desirable that the charge pump bias current track the process variations in filter capacitance, and keep the ratio constant. This would keep the damping factors, in particular the parameters that determines undershoot and overshoot during transients, much better controlled. So while the preferred embodiment reduces the dynamic range requirement of V-to-I converter 208, it also causes more variation in the PLL loop gain which, although not desirable, is manageable.

While the invention has been described in a preferred embodiment as applying to the biasing of a current controlled oscillator in a PLL, it should be recognized that the invention has application to other biasing environments. In particular, the preferred embodiment can be used anywhere there is current driven conversion of current to something else, such as the V-to-I converter of the PLL. In addition, the bias loop can be used as a means for raising the impedance of a current driven device, by reducing the current that needs to be provided by sources other than the biasing loop.

While the invention has been particularly shown and described with reference to a preferred exemplary embodiment thereof, it will be understood by those skilled in the art that various changes in form and details may be made therein without departing from the spirit and scope of the invention. It will be also understood that, while various of the conductors are shown in the drawing as single lines, they are not so shown in a limiting sense, and may comprise plural conductor, as is understood in the art.

We claim:

1. A current controlled semiconductor device, wherein said current controlled semiconductor device is biased with a bias current, said device comprising:

a) a first feedback path, said first feedback path dynamically controlling an output of said current controlled semiconductor device with a control current; and b) a second feedback path, said second feedback path including a bias loop, said bias loop determining the magnitude of said control current and thereby providing said bias current in response to said control current.

2. The device of claim 1 wherein said bias loop comprises a first current mirror and a second current mirror, and wherein said bias loop determines the magnitude of said control current by mirroring said control current to said bias current.

3. The device of claim 2 wherein said first and second current mirrors comprise field effect transistors.

4. The device of claim 2 wherein said first current mirror comprises N-channel field effect transistors and wherein said second current mirror comprises P-channel field effect transistors.

5. The device of claim 1 wherein said bias loop has substantially unity gain.

6. The device of claim 1 wherein said semiconductor device is a phase-locked loop.

7. The apparatus of claim 1 wherein said semiconductor device is a phase-locked loop and including a current controlled oscillator within said phase-locked loop which is supplied bias current by said bias loop.

8. The device of claim 1 further comprising a start up mechanism, said start-up mechanism including a current mirror, said current mirror effecting a start-up current in said bias loop on power-up of said current controlled semiconductor device.

9. The device of claim 1 wherein said bias current tracks said control current.

10. A self-biased current controlled oscillator in a phase-locked loop, wherein said current controlled oscillator generates an output signal with a frequency proportional to an input current, wherein said input current includes the sum of a bias current and a control current and wherein said control current is supplied by said phase-locked loop, said current controlled oscillator comprising:

a) a first current mirror, said first current mirror sinking said input current;

b) a second current mirror forming a feedback loop with said first current mirror, said feedback loop providing said bias current to said current controlled oscillator, wherein said bias current tracks said input current.

11. The current controlled oscillator of claim 10 wherein said first and second current mirrors comprise field effect transistors.

12. The current controlled oscillator of claim 10 wherein said feedback loop has substantially positive unity gain.

13. The current controlled oscillator of claim 10 wherein said first current mirror comprises N-channel field effect transistors and wherein said second current mirror comprises P-channel field effect transistors.

14. The current controlled oscillator of claim 10 further comprising a start up mechanism, said start-up mechanism including a third current mirror, said third current mirror effecting a start-up current in said bias loop on power-up of said self-biased current controlled oscillator.

15. A self-biased phase-locked loop, wherein said phase-locked loop includes a current controlled oscillator, a voltage-to-current converter and a charge pump, wherein said current controlled oscillator generates an output signal with a frequency proportional to an input current, the self-biased phase-locked loop comprising:

a) a first current mirror, said first current mirror mirroring a current responsive to said input current;

b) a second current mirror forming a feedback loop with said first current mirror, said feedback loop having substantially unity gain and providing a first bias current to said current controlled oscillator which is dynamically controlled by said feedback loop to track said input current;

c) a third current mirror, said third current mirror supplying a second bias current to said voltage-to-current converter that is proportional to said first bias current;

d) a fourth current mirror, said fourth current mirror supplying a third bias current to said charge pump that is proportional to said first bias current of said current controlled oscillator;

e) a start-up mechanism, said start-up mechanism supplying a start-up current to said second current mirror on power up of said phase-locked loop, said start-up mechanism turning off said start-up current when said first bias current is established.

16. The self-biased phase-locked loop of claim 15 wherein said first and second current mirrors comprise field effect transistors.

17. The self-biased phase-locked loop of claim 15 wherein said first current mirror comprises N-channel field effect transistors and wherein said second current mirror comprises P-channel field effect transistors.

18. A method for self biasing a current controlled device, wherein an output of said current controlled device is determined by an input current, the method comprising the steps of:

a) providing an input current to said current controlled device:

b) dynamically adapting said input current to control said output;

c) mirroring back said input current along a feedback bias loop;

d) inputting said mirrored input current to said current controlled device as a bias current.

19. The method of claim 18 wherein the step of mirroring back said input current along a feedback bias loop comprises mirroring back along a feedback bias loop with substantially unity gain.

20. The method of claim 18 wherein said current controlled device comprises a current controlled oscillator.

21. The method of claim 18 wherein the step of providing said input current to said current controlled device is performed by a phase-locked loop.

22. A method for self-biasing a current controlled oscillator in a phase-locked loop wherein the frequency of an output of said current controlled oscillator is determined by an input current, the method comprising the steps of:

a) providing a control current in response to a detected phase difference between said output and a reference input, said control current being proportional to said detected phase difference;

b) driving said current controlled oscillator with said input current, said input current including the sum of said control current and a bias current;

c) mirroring said input current back to said current controlled oscillator, said mirroring back supplying said bias current to said current controlled oscillator.

* * * * *